United States Patent
Davies et al.

(10) Patent No.: US 11,018,461 B2
(45) Date of Patent: May 25, 2021

(54) POWER PLUG FOR MONITORING APPLIANCE PERFORMANCE

(71) Applicant: Green Running Limited, Bath (GB)

(72) Inventors: Peter Davies, London (GB); Conrad Spiteri, London (GB); Steve Willoughby, London (GB)

(73) Assignee: Green Running Limited, Bath (GB)

( * ) Notice: Subject to any disclaimer, the term of this patent is extended or adjusted under 35 U.S.C. 154(b) by 0 days.

(21) Appl. No.: 15/886,926

(22) Filed: Feb. 2, 2018

(65) Prior Publication Data

US 2018/0226755 A1    Aug. 9, 2018

(30) Foreign Application Priority Data

Feb. 3, 2017    (GB) ..................... 1701835

(51) Int. Cl.
    *H01R 13/00*    (2006.01)
    *H01R 13/66*    (2006.01)
    (Continued)

(52) U.S. Cl.
    CPC ....... *H01R 13/6683* (2013.01); *G01R 21/133* (2013.01); *G05B 15/02* (2013.01); *H01R 13/6658* (2013.01); *H01R 13/6691* (2013.01); *H01R 13/70* (2013.01); *H01R 13/7175* (2013.01); *H02J 3/14* (2013.01); *H02J 13/0006* (2013.01); *H04L 12/10* (2013.01);
    (Continued)

(58) Field of Classification Search
    CPC ........ H01R 13/00; G01R 21/00; G05B 15/00; H02J 3/00; H02J 13/00

USPC .......................................................... 307/116
    See application file for complete search history.

(56) References Cited

U.S. PATENT DOCUMENTS

| 4,652,139 A | 3/1987 | Sulcer, Jr. |
| 4,920,549 A | 4/1990 | Dinovo |

(Continued)

FOREIGN PATENT DOCUMENTS

| CN | 202103276 U | * 1/2012 |
| CN | 202103276 U |   1/2012 |

(Continued)

OTHER PUBLICATIONS

M. Ahmed et al., "Smart plug prototype for monitoring electrical appliances in Home Energy Management System," 2015 IEEE Student Conference on Research and Development (SCOReD), Kuala Lumpur, 2015, pp. 32-36.

(Continued)

*Primary Examiner* — Rexford N Barnie
*Assistant Examiner* — Joseph N Inge
(74) *Attorney, Agent, or Firm* — Blank Rome LLP

(57) ABSTRACT

A power plug for coupling an electrical appliance to an electrical power supply, comprising: a current sensor, configured to measure current supplied through the plug to the electrical appliance; a voltage sensor, configured to measure voltage supplied through the plug to the electrical appliance; a processor configured to: determine power consumption data from data relating to the current and voltage measurements made by the current and voltage sensors; and monitor the performance of the electrical appliance using the power consumption data; and a transmitter, configured to transmit information relating to the performance of the electrical appliance.

16 Claims, 6 Drawing Sheets

(51) Int. Cl.
| | |
|---|---|
| *H02J 3/14* | (2006.01) |
| *H02J 13/00* | (2006.01) |
| *G01R 21/133* | (2006.01) |
| *G05B 15/02* | (2006.01) |
| *H01R 13/70* | (2006.01) |
| *H01R 13/717* | (2006.01) |
| *H04L 12/10* | (2006.01) |
| *G01D 4/00* | (2006.01) |
| *H01R 24/28* | (2011.01) |
| *H01R 103/00* | (2006.01) |

(52) U.S. Cl.
CPC .............. *G01D 4/002* (2013.01); *H01R 24/28* (2013.01); *H01R 2103/00* (2013.01); *Y02B 70/30* (2013.01); *Y02B 70/3225* (2013.01); *Y02B 90/20* (2013.01); *Y04S 20/00* (2013.01); *Y04S 20/222* (2013.01); *Y04S 20/242* (2013.01); *Y04S 20/30* (2013.01)

(56) References Cited

U.S. PATENT DOCUMENTS

| | | | |
|---|---|---|---|
| 5,315,236 A | 5/1994 | Lee | |
| 6,340,926 B1* | 1/2002 | Chu | H01H 83/04 337/407 |
| 6,445,188 B1 | 9/2002 | Lutz et al. | |
| 2005/0099314 A1 | 5/2005 | Aisa | |
| 2007/0247134 A1 | 10/2007 | Ryan et al. | |
| 2007/0276548 A1* | 11/2007 | Uzunovic | H04L 12/12 700/297 |
| 2009/0251832 A1* | 10/2009 | Brugner | H01R 13/6683 361/42 |
| 2010/0023283 A1* | 1/2010 | Boutorabi | G01R 19/2513 702/60 |
| 2010/0070217 A1* | 3/2010 | Shimada | H04Q 9/00 702/62 |
| 2010/0094475 A1 | 4/2010 | Masters et al. | |
| 2010/0148591 A1 | 6/2010 | Lim | |
| 2011/0022242 A1 | 1/2011 | Bukhin et al. | |
| 2011/0061014 A1 | 3/2011 | Frader-Thompson et al. | |
| 2011/0082599 A1 | 4/2011 | Shinde et al. | |
| 2012/0013442 A1* | 1/2012 | Lee | G06F 1/305 340/6.1 |
| 2012/0049639 A1* | 3/2012 | Besore | G01K 3/005 307/97 |
| 2012/0080949 A1 | 4/2012 | Gelonese | |
| 2013/0164971 A1* | 6/2013 | Chung | H01R 13/665 439/489 |
| 2013/0245849 A1* | 9/2013 | Paul | G05B 15/02 700/295 |
| 2013/0338844 A1 | 12/2013 | Chan et al. | |
| 2014/0088780 A1 | 3/2014 | Chen | |
| 2014/0333324 A1* | 11/2014 | Kabler | G06Q 50/06 324/537 |
| 2015/0048679 A1* | 2/2015 | Kotowski | G08C 17/00 307/31 |
| 2015/0185261 A1* | 7/2015 | Frader-Thompson | G01R 21/00 702/61 |
| 2016/0033985 A1 | 2/2016 | Gulli' et al. | |
| 2016/0141810 A1 | 5/2016 | Kashyap et al. | |
| 2016/0343232 A1* | 11/2016 | Itzler | H02J 13/00026 |
| 2017/0131328 A1 | 5/2017 | Lorek | |

FOREIGN PATENT DOCUMENTS

| | | | |
|---|---|---|---|
| CN | 104241988 A | * | 12/2014 |
| CN | 104241988 A | | 12/2014 |
| CN | 106450958 A | | 2/2017 |
| CN | 106803631 A | | 6/2017 |
| EP | 2 105 999 A1 | | 9/2009 |
| EP | 2 221 586 A1 | | 8/2010 |
| KR | 10-2015-0111804 | | 10/2015 |
| WO | WO 2013/106160 A1 | | 7/2013 |
| WO | WO 2013/137725 A1 | | 9/2013 |

OTHER PUBLICATIONS

M. Ghazal et al., "Smart Plugs: Perceived usefulness and satisfaction: Evidence from United Arab Emirates," Renewable and Sustainable Energy Review, vol. 55, 2016, pp. 1248-1259.

TI Designs, Smart Plug with Remote Disconnect and Wi-Fi Connectivity, TIDU531, Sep. 2014, 28 pages. http://www.ti.com/lit/ug/tidu531.pdf.

S-H Lee et al, "An Intelligent power monitoring and analysis for distributed smart plugs sensor networks," Special Issue (Innovative Services and Applications of Wireless Sensor Networks), International Journal of Distributed Sensor Networks 2017, vol. 13 (7) pp. 1-13.

M. Aftab et al., "Real-time Appliance Identification using Smart Plugs," In Proceeding of e-Energy '17, Shatin, Hong Kong, May 16-19, 2017, 2 pages. http://www.smartsustainability.org/papers/osplug2.pdf.

\* cited by examiner

POWER PLUG FOR MONITORING APPLIANCE PERFORMANCE

CROSS-REFERENCE TO RELATED APPLICATIONS

This application is based upon and claims the benefit of priority from prior United Kingdom Application number 1701835.9 filed on Feb. 3, 2017, the entire contents of which are incorporated herein by reference.

FIELD OF THE INVENTION

The present invention relates to a power plug, and more particularly to a power plug for coupling an electrical appliance to an electrical power supply.

BACKGROUND

It is desirable for various reasons to know the performance, and optionally the status (e.g. "on" or "off"), of an AC or DC appliance or of a piece of equipment that is connected as a load to an AC or DC power source, and optionally to turn the load or appliance on or off.

Numerous power-monitoring devices are available which connect externally between the power source and load, or within the plug of the said load.

BRIEF DESCRIPTION OF THE DRAWINGS

For a more complete understanding of the invention, reference is made to the following description and accompanying drawings, in which.

DETAILED DESCRIPTION

Figure 1:
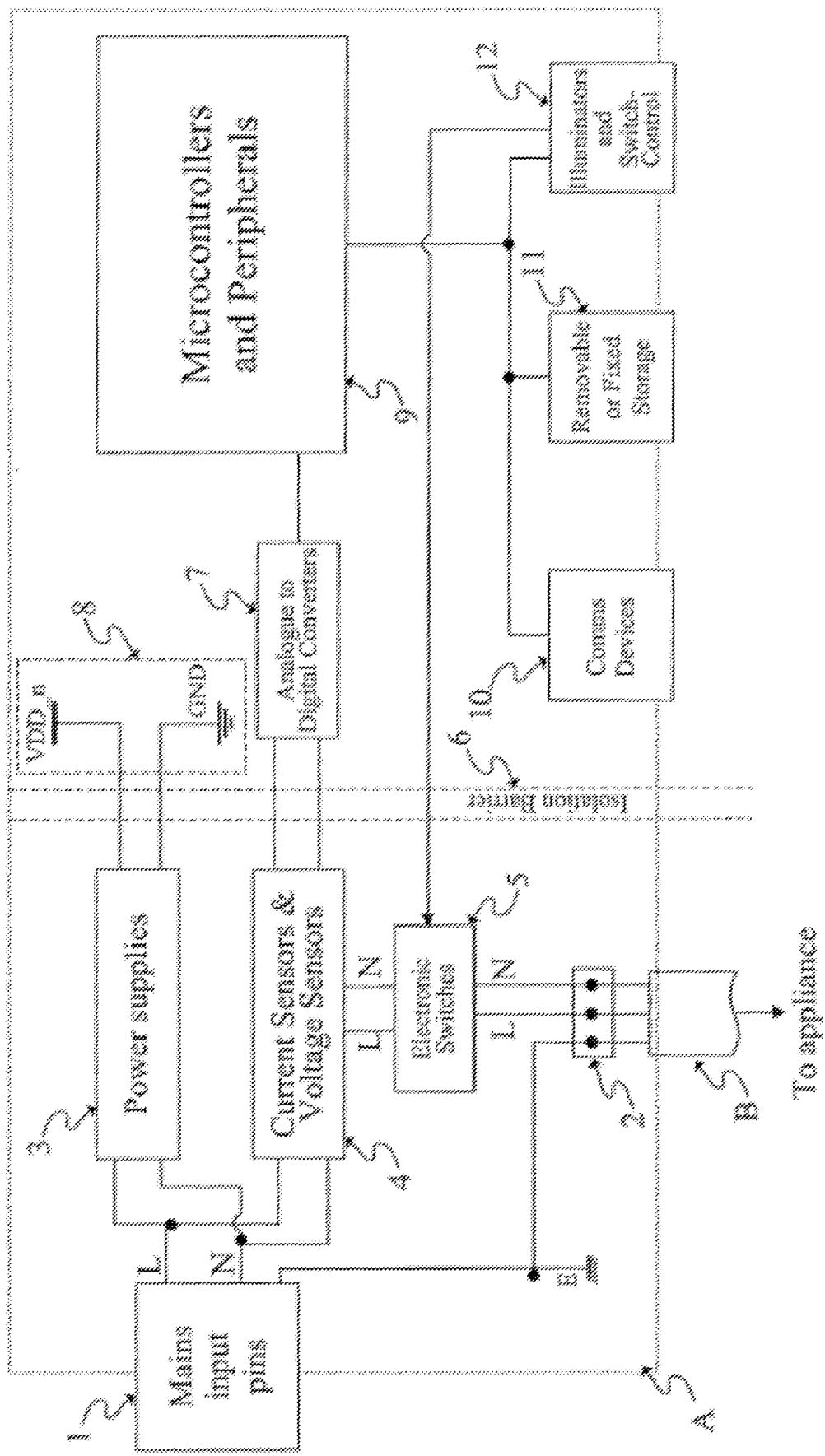
FIG. 1 is an internal block diagram of a power plug according to an embodiment, where the diagram also shows the connections of the plug to the outside world.
Figure 2A:
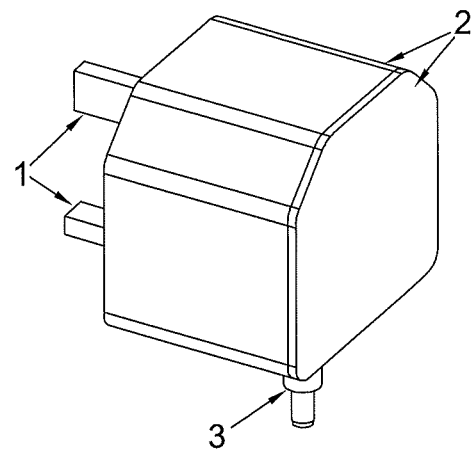
FIG. 2(a) and FIG. 2(b) are perspective views of the power plug from two different isometric angles, where the diagrams also show the external case 2, and the connection of the plug pins 1 and power cord gland 3.
Figure 2B:
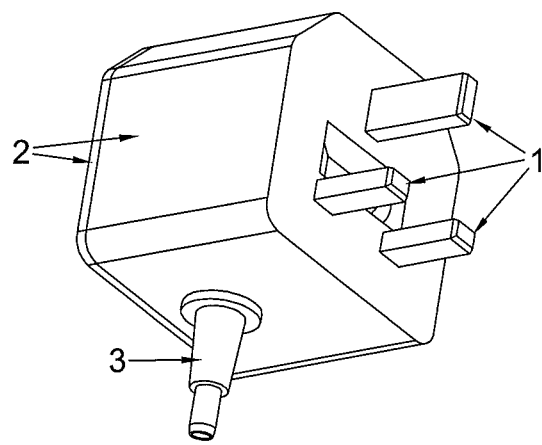

According to an embodiment, there is provided a power plug for coupling an electrical appliance to an electrical power supply, comprising:
a current sensor, configured to measure current supplied through the plug to the electrical appliance;
a voltage sensor, configured to measure voltage supplied through the plug to the electrical appliance;
a processor configured to:
determine power consumption data from data relating to the current and voltage measurements made by the current and voltage sensors;
monitor the performance of the electrical appliance using the power consumption data;
a transmitter, configured to transmit information relating to the performance of the electrical appliance.

The terms "monitoring condition" and "monitoring performance" are used interchangeably in the present application to refer to monitoring whether a fault has developed in the appliance, for example in one or more components of the appliance.

Monitoring the performance of the electrical appliance may comprise repeatedly generating a feature set using the power consumption data, wherein the feature sets comprise one or more features, and comparing each generated feature set to comparison data.

The comparison data may be generated using one or more feature sets previously generated using power consumption data from previously measured current and voltage data. Alternatively, the comparison data may be stored data obtained from a manufacturer or from measurements of a similar appliance for example.

Repeatedly generating a feature set may comprise extracting a portion of the power consumption data at regular time intervals. Comparing each generated feature set to comparison data may comprise comparing the feature set corresponding to the current time interval with a feature set generated for one or more previous time intervals. The previous time intervals may be any previously recorded time interval or an average over two or more previously recorded time intervals for example. Alternatively, the comparison data may be stored data obtained from a manufacturer or from measurements of a similar appliance for example.

Repeatedly generating a feature set may comprise monitoring the power consumption data for an event, extracting a portion of the power consumption data, the portion being identified using the event and extracting the feature set from the portion. Comparing each generated feature set to comparison data may comprise comparing the feature set extracted from the portion to a feature set generated using one or more feature sets generated for previously extracted portions. The previous portions may be any previously recorded portions or an average over two or more previously recorded portions for example. Alternatively, the comparison data may be stored data obtained from a manufacturer or from measurements of a similar appliance for example.

The processor may be further configured to identify a decrease in performance when a difference between the current generated feature set and the comparison data passes a threshold difference.

The processor may be further configured to determine the status of the appliance.

The power plug may further comprise a memory module, comprising non-volatile memory and configured to store the generated feature sets.

The feature set may comprise information relating to a switch on frequency of one or more components of the electrical appliance. For example, the information may comprise an average switch on frequency. The information may comprise one or more of: the number of times the component switches on in a fixed time period, the average number of times the component switches on in a fixed time period where the average is taken over a longer fixed time period, the time between a switch on and switch off, and the average time between a switch on and switch off.

The feature set may alternatively or additionally comprise information relating to one or more of: a duration of switch on time of one or more components of the electrical appliance, information relating to an event during an operation cycle, amount of power consumed over a period of time, amount of power consumed at regular intervals during a time period identified using an event, duration of an event, and time of occurrence of an event within an operation cycle.

In an embodiment, the current sensor is configured to measure current supplied through the plug to the electrical appliance at a first sampling frequency and the voltage sensor is configured to measure voltage supplied through the plug to the electrical appliance at a second sampling frequency. The first and second sampling frequency may be the same. In an embodiment, the second sampling frequency is greater than or equal to 1 MHz.

The power plug may further comprise an analogue to digital converter, configured to digitize the current and voltage measurements.

The power plug may further comprise an electronically controlled switch configured to allow power supply to the electrical appliance in a first configuration and prevent power supply to the electrical appliance in a second configuration. The processor may be further configured to instruct the switch to transition from the first configuration to the second configuration in response to an instruction received at the communication module or in response to an identified decrease in performance or in response to user input.

The power plug may further comprise a display module, configured to display when a decrease in performance is identified. The display module may comprise one or more LEDs, for example.

The power plug may further comprise an isolation component, wherein the voltage sensor is coupled to the processor through the isolation component.

The power plug may further comprise removable non-volatile memory configured to store the power consumption data and generated feature sets. In an embodiment, the performance is monitored in real-time.

The communication module may be configured to communicate with other locally networked devices. In an embodiment, the communication module is configured to communicate over an internet connection.

In an embodiment, the plug is configured to record voltage spikes, surges, brief dropouts and/or other perturbations of the supply line.

In an embodiment, the plug is built into a plug-body. In an embodiment, the plug incorporates certain monitoring capabilities, including monitoring the voltage signal (e.g. allowing the power factor, i.e. phase shift to be determined) and/or analysing the data (for example to determine performance). In an embodiment, the plug is connected to a network (for example the internet) and is configured to upload data to a remote system (for example a cloud system) for additional analysis. In an embodiment, the plug is configured to allow the connected appliance to be switched on or off remotely.

In an embodiment, the plug is able to communicate with external devices while the connected appliance is in operation. In an embodiment, the plug is able to control the operational status of the connected appliance or load by turning the said appliance on or off. In an embodiment, the plug is able to receive instructions and/or have an internal embedded program running on the microcontroller changed while the appliance is in operation.

The present invention relates generally to a "smart" power plug for an electrical appliance, which may be user re-wireable for example.

In particular, one or more miniature printed circuit boards may be assembled into the plug body such that the AC or DC electricity from an electrical socket passes through the fused mains input pins to the appliance power cord directly.

In an embodiment, the plug is able to read the voltage and current, being consumed by the appliance, at high frequency to store, analyse and communicate the performance of the appliance. In an embodiment, the plug is also capable of turning the appliance on or off when instructed by the internal microcontrollers and/or external sources. Furthermore, the plug may be able to infer the performance of the appliance over time in order to determine whether the appliance is operating efficiently. By way of example only, the plug may be able to analyse and store one or more feature sets of the appliance. The feature sets may then be subsequently compared to the current performance of the appliance, where a substantial deviation from the historical feature sets is able to trigger a communication, for example with the user, to warn of a potential fault developing within the appliance being monitored.

In the AC or DC power monitoring device, the entire electronic circuit may be self-contained within a standard AC or DC plug body, being any type of conventional plug used for 110 volt, 220 volt or other AC or DC voltages as specified by IEC TR 60083:2015 or other such bodies for example. The plug may be able to communicate with various other networked devices and furthermore to determine the performance of the attached device.

According to another embodiment, there is provided an electrical appliance, comprising the power plug.

According to another embodiment, there is provided a method of monitoring performance of an electrical appliance coupled to a power plug comprising:
  measuring current supplied through the plug to the electrical appliance;
  measuring voltage supplied through the plug to the electrical appliance;
  determining power consumption data from data relating to the current and voltage measurements made by the current and voltage sensors;
  monitoring the performance of the electrical appliance using the power consumption data;
  transmitting information relating to the performance of the electrical appliance.

According to another embodiment, there is provided a carrier medium comprising computer readable code configured to cause a computer to perform the method.

The method is a computer-implemented method. Since some methods in accordance with embodiments can be implemented by software, some embodiments encompass computer code provided to a general purpose computer on any suitable carrier medium. The carrier medium can comprise any storage medium such as a floppy disk, a CD ROM, a magnetic device or a programmable memory device, or any transient medium such as any signal e.g. an electrical, optical or microwave signal. The carrier medium may comprise a non-transitory computer readable storage medium.

FIG. 1 shows a block diagram of a power plug according to an embodiment. The plug may be an intelligent, self-contained, in-line electrical plug encapsulating a number of miniature printed circuit boards assembled into the plug body A, such that the AC or DC electricity from an electrical socket passes through the fused mains input pins 1, to the appliance power cord B directly. The power plug may be an AC or DC power plug. Appliances with a DC power supply may include emergency lightning or intruder alarms for example.

In an embodiment, the plug is also user re-wireable through the terminal block 2. In an alternative embodiment, the plug is directly connected to the appliance power cord B during manufacturing. The circuit boards comprise one or more of: one or more power supplies 3; one or more microcontrollers 9; one or more current and voltage sensors 4; one or more analogue to digital converters 7; one or more electronic switches 5 such as a relay; one or more illuminated indicators and/or one or more user interaction switches 12; one or more communication devices 10; and may further comprise removable storage 11.

The one or more power supplies 3 are connected to $VDD_n$ and GND lines. These lines supply power to one or more components within the plug. $VDD_n$ comprises a number of DC power supplies at different voltages that power the various chips inside the power plug. Different chips may have different voltage requirements. In an embodiment, three different voltages are used (3.3V, 1.8V and 1.5V). The VDD connection to the chips is not shown in the diagram.

In an embodiment, the plug is able to read voltage and current at high frequency to store, analyse and communicate the performance of the appliance. In an embodiment, the plug is also capable of turning the appliance on or off when instructed by the internal microcontrollers and/or external sources. Furthermore, the plug may be able to infer the performance of the appliance over time in order to determine whether the appliance is operating efficiently. By way of example only, the plug is able to analyse and store the performance of an appliance and compare its current performance to historical data, whether the historical data is located within the plug or remotely stored on the network or external servers as described in more detail below.

The power plug is suitable for coupling an electrical appliance to an electrical power supply. The electrical power supply may be a mains power supply or a DC power supply for example. The plug may be wired to the electrical appliance. The plug comprises two or more input pins 1, which couple to conductive elements in a power supply socket (not shown) when the plug is connected to the power supply socket. The plug shown in FIG. 1 comprises a live, neutral and earth pin, but any kind of plug design may be used. The plug design may depend on the country.

The plug further comprises a current sensor, configured to measure current supplied through the plug to the electrical appliance, and a voltage sensor, configured to measure voltage supplied through the plug to the electrical appliance. The current and voltage sensor are shown housed in a single element 4 in the diagram, but may be separately located. The current sensor may be a differential type sensor (such as a differential Hall Effect sensor), a magnetic pick-up device using a current sensing inductor, or a low value resistor for example. The voltage sensor may be any component that outputs a low voltage signal that is representative and proportional to the input voltage, for example a voltage divider.

The current and voltage sensors 4 are electrically connected to the live and/or neutral line, between the input pins 1 and an output power cable B connected to the electrical appliance. One or more further components (such as one or more electronic switches 5 and/or a terminal block 2) may optionally be coupled between the sensors 4 and the cable B. One or more further components may optionally be coupled between the sensors 4 and the input pins 1.

The mains signal may comprise a single phase signal comprising a single current and voltage signal, a split phase (or dual phase) signal comprising two current signals and two voltage signals, or a three phase signal comprising three current signals and three voltage signals. Each signal may be measured by a current or voltage sensor and analysed in order to monitor performance of the appliance. For example, in a split phase system there is a Live1, Live2 and Neutral signal pair, and there is a sensor pair for each voltage.

The current sensor is configured to measure current supplied through the plug to the electrical appliance at a first sampling frequency and the voltage sensor is configured to measure voltage supplied through the plug to the electrical appliance at a second sampling frequency. The second sampling frequency may be greater than or equal to 1 MHz for example. The first and second sampling frequency may be the same. Thus the current and voltage sensors may sample the current and voltage supplied to the electrical appliance through the plug at a read or sampling frequency, generating the current and voltage data. The current and voltage sensors may optionally be coupled to one or more ADCs 7, which digitize the sampled current and voltage data.

An isolation barrier element 6 may optionally be included between the current and voltage sensors and the further analysis components such as the ADC 7 and a processor 9. The isolation barrier 6 protects the ADC 7 and processor 9 from the high voltage or current electricity inputted to the plug from the power supply, and may be a physical separation or one or more electronic isolation components for example.

The ADC 7 outputs the data to a processor 9, which in this case is a microcontroller 9 but may be any suitable processing device or devices. The microcontroller unit 9 may further comprise one or more of a real-time clock, a memory, power supply, voltage and/or current conditioning circuits and filters, isolating circuits, non-volatile memory, and fixed or removable data storage for example. The processor 9 is configured to determine power consumption data from data relating to the current and voltage measurements made by the current and voltage sensors, and to monitor the performance of the electrical appliance using the power consumption data.

The plug further comprises a transmitter 10, labelled "comms devices" in the figure. The comms device 10 is configured to transmit information relating to the performance of the electrical appliance. The processor 9 outputs information relating to the performance of the appliance to the comms device 10, which then transmits the information, for example over a network. The comms device 10 may be further configured to receive transmitted information from external devices over a network.

The plug may optionally comprise removable or fixed storage 11, which receives data from the processor 9 and stores the data. The storage 11 may store further information used for processing the power consumption data, for example a set of benchmark features and/or one or more threshold values for example. The storage may store further information including historic data or features, as will be described below for example.

The plug may optionally comprise a switch control 12, which may be configured to receive a signal from the processor 9 and/or communication device 10 and/or as a result of direct input from a user. The switch control 12 is connected to electronic switches 5 which are connected between the current and voltage sensors 4 and the terminal block 2 to the cable B. The switches 5 may be one or more relay switches. The switch control 12 is configured to control the electronic switches 5 to switch the appliance on and off in response to input received at the switch control 12 from the processor 9 and/or the communication device 10 and/or user. The connection between the electronic switches 5 and the switch control 12 is through the isolation barrier 6. The switches 5 and switch control 12 are thus configured to allow power supply to the electrical appliance in a first configuration and prevent power supply to the electrical appliance in a second configuration, and the processor 9 is further configured to instruct the switch control to transition the switch from the first configuration to the second configuration in response to an instruction received at the communication module 10 or in response to an identified decrease in performance identified at the processor 9 or in response to input from a user.

The plug may optionally comprise one or more illuminators 12. The illuminators 12 may be one or more LEDs for example. The illuminators may be configured to illuminate in response to an instruction from the processor 9 and/or the communication device 10. The illuminators 12 are an example of a display module. An alternative type of display module may be used, for example a screen.

The power consumption data may be one or more of a real power, apparent power or RMS power signal calculated at the processor 9 from the current and voltage data, and may be calculated using windows corresponding to 1 or more mains cycles for example.

In an embodiment, the RMS and power factor (the shift in phase of the current signal when compared to the voltage signal) values are calculated over a number of mains cycles, to improve the signal to noise ratio.

In an embodiment, a real power value $P_I$ for a window I is calculated at the processor 9 using the expression:

$$P_I = \frac{1}{N} \sum_{n=1}^{N} v_n(t) i_n(t), \quad t \in T_I$$

where N is the number of samples in each window I and $v_n(t)$ and $i_n(t)$ are the current and voltage values for the sample n of the voltage and current signals, with or without background removed. For a 10 kHz read frequency in a country with 50 Hz main power, where the window corresponds to 1 mains cycle, N=200.

In an embodiment, an apparent power value $|S|_I$ for a window I is calculated at the processor 9 from:

$$|S|_I = \frac{1}{N} \sqrt{\sum_{n=1}^{N} v_n(t)^2} \sqrt{\sum_{n=1}^{N} i_n(t)^2}, \quad t \in T_I$$

In an embodiment, real power, apparent power and RMS power are all calculated.

Real power corresponds to the apparent power multiplied by the power factor (the shift in phase of the current signal when compared to the voltage signal).

Monitoring the performance of the electrical appliance may comprise repeatedly generating a set of one or more features using the power consumption data and comparing each generated feature set to comparison data at the processor 9.

In an embodiment, a portion of the power consumption data may be analysed at regular time intervals. The feature set corresponding to the current time interval may be compared with a feature set generated for a previous time interval or to a stored pre-determined feature set for example. The time interval may be a 24 hour period. An average feature set for a 24 hour period may be generated from multiple feature sets for a number of periods within the 24 hour period for example. For example, a feature set comprising one or more features for each 5400 second period in 24 hours may be generated. The average value of each feature is then determined. The final feature set corresponds to the average value of each feature for the 24 hour period.

Alternatively, the power consumption data may be monitored for an event, and a portion of data identified corresponding to the event then analysed. The feature set corresponding to the current portion is then compared with a feature set generated for a previous event or a stored pre-determined feature set for example.

Monitoring for an event may comprise monitoring the power consumption signal for a change in magnitude greater than a threshold value for example. The threshold value depends on the appliance and may be pre-selected or determined and then stored in the plug for example. In an embodiment, a change is detected by calculating the difference between adjacent power samples in the real power time series signal, referred to as the deltapower. When the deltapower value exceeds the threshold value, an event is detected. Alternatively, an event may be detected only if the sum of the deltapower values within a specified time window exceeds the threshold value for example. The time window again may be appliance dependent. In an embodiment, the time window is 600 ms. In an embodiment, where the utility consumption signal comprises a split or three phase electrical signal, monitoring for a change in the magnitude of the input signal may comprise monitoring the power consumption signal corresponding to each phase, where a change detected in any of the signals is registered as a change. When a change is detected, a portion of the power time series signal comprising the detected change in magnitude is extracted and stored, and a feature set comprising one or more features extracted.

For example, a kettle has only two states (on or off) with a power draw between 100 and 2000 watts in the on state for example, therefore the event detection threshold (to analyse the signal or upload information to the cloud for example) may be set to a value within this range, for example at 800 Watts or 300 Watts. For a washing machine, which has various low power components, the threshold may be set at the minimum possible value corresponding to an event (determined from historic or model data). In an embodiment, this threshold is 10 Watts. Other appliances may have different thresholds depending on their operational states and power consumption. The threshold value for the appliance is stored in the plug.

The comparison data may be generated using one or more feature sets previously generated using power consumption data from previously measured current and voltage. Alternatively, a pre-determined feature generated by the manufacturer for the particular model may be used for example.

The feature set may comprise information relating to a switch on frequency of one or more components of the electrical appliance. This may be average frequency of switch on of the component over a period of time. This may be the number of times the component switches on in a fixed time period. This may be the average number of times the component switches on in the fixed time period, where the average is taken over a longer fixed time period. This may be the duty cycle (i.e. time since the last switch off of the component) or average duty cycle.

The feature set may comprise information relating to a duration of switch on time of one or more components of the electrical appliance.

The feature set may additionally or alternatively comprise other information relating to an event during an operation cycle.

The feature set may comprise amount of power consumed over a period of time.

The feature set may comprise amount of power consumed at regular intervals during a time period identified using an event.

The feature set may comprise duration of an event.

The feature set may comprise time of occurrence of an event within an operation cycle.

Extraction of a feature set comprising one or more features which are used for performance monitoring will be described in more detail in relation to the examples below.

Comparing the feature sets may comprise identifying a decrease in performance when a difference between the value of a feature in the current generated feature set and the value of the feature in the comparison data passes a threshold difference for example. Alternatively, comparing the feature sets may comprise identifying a decrease in performance when the value of a feature in the current generated feature set passes a threshold value for example (i.e. falls below a minimum threshold, or rises above a maximum threshold). Alternatively, comparing the feature sets may comprise identifying a decrease in performance when the value of a feature in the current generated feature set does not reach a target value for example (i.e. does not reach a maximum value or does not drop to a minimum value). This will be described in more detail in relation to the examples below.

For a plug attached to a particular appliance or appliance type the processor is pre-programmed or configured to extract a particular type of data, i.e. one or more particular features from the power consumption data. The plug may also comprise stored information specific to the particular appliance or appliance type used for comparison.

The processor 9 may be further configured to determine the status of the appliance (for example whether the device is "on" or "off"). This may be determined from information relating to the position of the switch 5 (e.g. relay—"on" or "off"). Information relating to the position (i.e. setting) of the switch 5 may be sent from the switch controller 12 to the processor. The status may additionally be determined from information relating to whether the appliance is drawing any current or power from the power supply, i.e. whether it is operational or not. Information relating to whether the appliance is drawing power may be sent from the current and/or voltage sensors 4 to the processor 9. Based on this information, the processor determines the status of the appliance. Information relating to the status of the appliance may additionally be transmitted from the comms device 10.

Example 1

By way of example, the plug could be attached to a fridge or freezer to analyse and store the power consumption information of the fridge or freezer over time, here-in-after referred to as extracting and storing a feature set. When, for example, the fridge or freezer seal starts to wear and fails to seal the appliance door properly, the ingress of warmer air into the appliance would increase the internal temperature quicker than when the seal was intact. The internal thermostat would trigger the appliance compressor to switch on more frequently to compensate for the increase in temperature. This variation in the electricity consumption pattern would initially be subtle but would eventually be significant enough to differentiate from normal operation. Given the plug has built a history of the said appliance power cycles and patterns, the plug would be able to raise an alarm in the form of communication with external devices indicating that the fridge may need servicing.

In further detail, during a normal operation cycle the fridge or freezer turns on the compressor motor at intervals depending on the temperature requirements of the appliance. These regular intervals and their occurrence during the day and night are recorded and stored. The turn-on cycles are then compared to the feature sets collected during the previous years of operation. Should the appliance door seal start to fail and leak warm air into the appliance, the compressor motor is forced to turn on more regularly in order to maintain the desired temperature. This is known as the switch on frequency. Typically for a domestic fridge or freezer, the data shows that the switch on frequency increases over time, however if the appliance is performing well, the increase in switch on frequency is typically less than 1 minute over the course of a number of years. When a door seal starts failing the motor is turned on more frequently, typically 2 to 3 minutes earlier than the same cycles in the previous years of operation. This depends on the severity of the seal failure.

Figure 4:
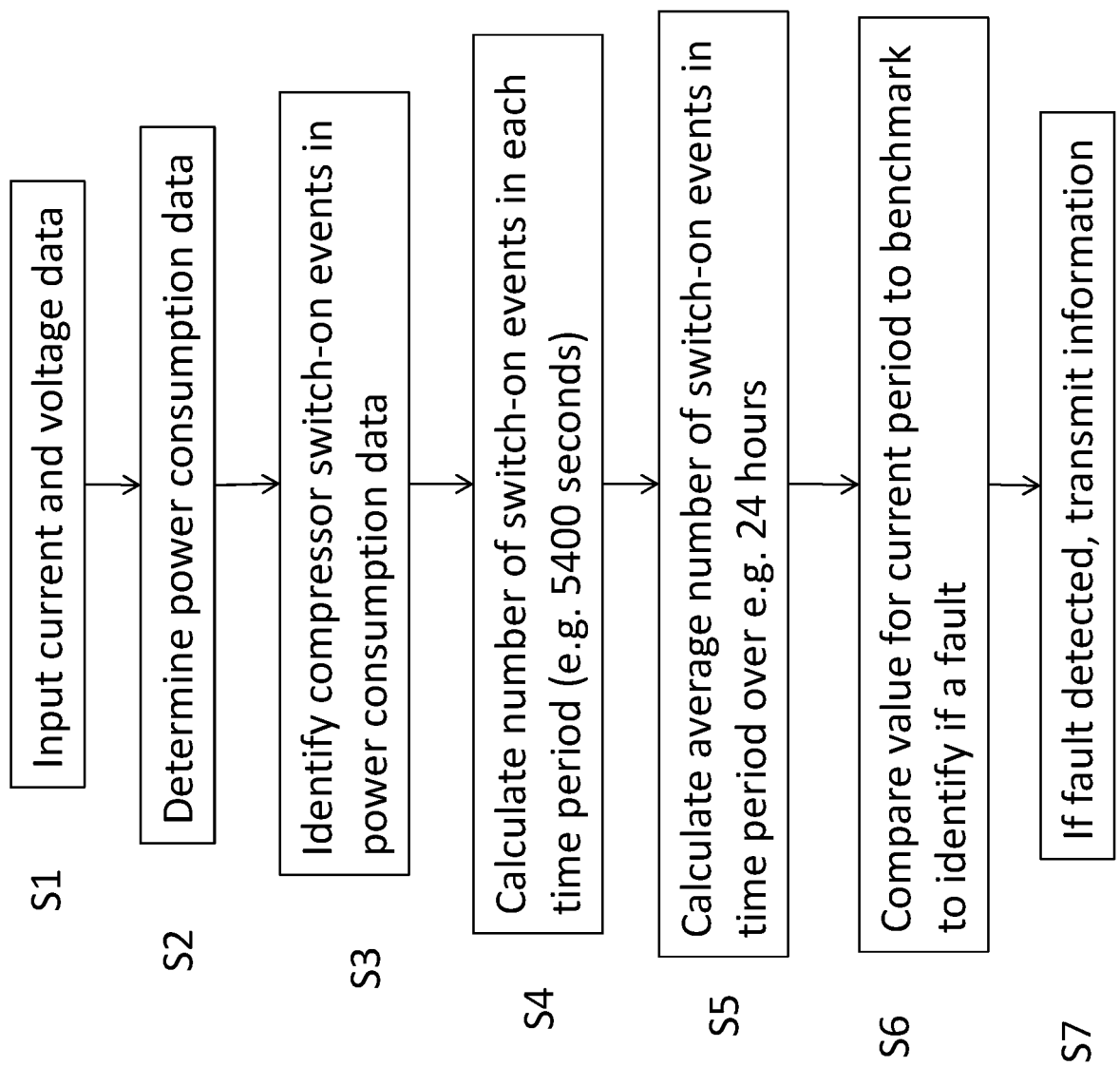
FIG. 4 is a flow chart of a method of monitoring performance of an appliance coupled to a plug.

In this example, the electrical appliance is a fridge or freezer type appliance. A flow chart showing the method of performance monitoring described is shown in FIG. 4. The current and voltage data measured by the sensors is input to the processor 9 in S1, which determines the power consumption data in S2 as has been described previously (for example by determining real power, apparent power and RMS power signals).

A feature set comprising one or more features is then extracted from the power consumption data. In this example, the feature set comprises information relating to a switch on frequency (for example average number of times the component switches on in a fixed time period and/or a duty cycle) of the compressor motor in the device. The information may comprise the average number of times the compressor switched on in a 5400 second period, the average being taken over the last 24 hours for example.

Although the example describes using information relating to switch on frequency, additionally or alternatively the duration of each switch on period may be used as a feature, for example. In this case, an increase in the duration as identified using the benchmark data indicates a fault in the seal.

The processor is configured to extract information relating to the compressor switch on times from the power consumption data. Each compressor switch on event is identified from the power consumption data in S3. The compressor event for a particular appliance may be identified by an increase in magnitude greater than a particular threshold, where the threshold is set for the particular appliance for example. A compressor can consume anything between 20 W and 2000 W depending on the type of appliance. The threshold may be set in this range for example. An event identified in any of the real power, apparent power and RMS power signals may be counted as an event for example. Similarly, an event identified in any of the two or three phase signals may be counted as an event for example.

A time stamp corresponding to the switch on time is stored for each identified switch on event. The switch-off time may also be recorded. This time stamp data is then used to determine information relating to a switch on frequency. For example, the processor may determine how many times the compressor switched on during each 5400 second period over the last 24 hour period from the time stamps, and then take the average of these. Thus in S4, the number of switch-on events in each 5400 second time period is determined. In S5, the average is taken from all of the 5400 second time periods in the previous 24 hours. This average value is the extracted feature. Thus in this example, the processor 9 is configured to extract one feature relating to the switch-on frequency for every 24 hour period. Alternatively, the processor may determine the average number of times that the compressor switches on during a 24 hour period, the average being calculated as a rolling average over a number of days, for example 7 days. In this case, there is still one value extracted every 24 hours, however the value corresponds to the number of times the compressor switches on during 24 hours. In this example, the feature set is thus generated regularly, for example every 24 hours.

Additionally, one or more of the average power consumed (real, apparent and RMS power), the power factor, the Fourier transform of the on-cycle, the Fourier transform of a period (e.g. 500 ms) before turn-on and the Fourier Transform of a period (e.g. 500 ms) after turn-off may be recorded.

The processor may then compare the current value of the switch-on frequency information (e.g. corresponding to the current 24 hour period) to a bench mark value in S6, which may be a value calculated during a previous time period, or simply be a stored value or table of values for the model (which may be stored on the plug device or externally for example). For example, the processor may compare the average value corresponding to the current 24 hours to the average value generated for the same 24 hour period in the previous year. If the value differs from the benchmark by an amount greater than a threshold then a fault in the seal of the door is identified. In an embodiment, the threshold is 0.15 on the Z-score scale (normalized standard deviation), corresponding to 15%. If the present value increases by more than 15% of the benchmark value from the benchmark value, then a fault in the seal is identified.

When detected, information indicating that there is a fault is then sent to the transmitter 10, and transmitted in S7, for example to a user or supplier. In an embodiment, the information is transmitted through an API. The information may comprise the appliance identification, the fault detected, optionally the reasoning behind the fault detection and optionally the raw data on which the decision was taken. Information may also be sent to the illuminators 12, in response to which one or more illuminators are illuminated to indicate that there is a fault. Information may also be sent to the switch control, such that it may switch off the appliance.

The above described method may also be used to monitor for a fault where the plug is attached to a heating, ventilation and/or air conditioning system, for example a HVAC, or to a boiler pump for example.

Example 2

By way of a further example, the plug could be attached to a washing machine or dishwasher to analyse and store the power consumption information of the appliance over time. When for example the internal drain pipe works or filters start restricting due to foreign debris getting trapped within the said pipe works or filters, the draining duration of the appliance would progressively take longer until the point when the pipes or filters are completely blocked and the appliance never drains. Given the plug has built a history of the appliance power cycles and patterns, the plug would be able to raise an alarm in the form of communication with external devices indicating that the appliance may need servicing or its filters cleaned.

In further detail, during normal operation the water draining portion of the washing cycle typically takes no more than 2 seconds per litre of water. Typically, a washing machine fills with 5 to 7 litres of water at any one time. Therefore, the maximum time to drain all the water should not exceed 10 to 15 seconds depending on the model. The benchmark time may be determined through historic feature set analysis and storage. If a blockage starts forming in the drain pipe, the drain cycle would take longer. By way of example, if a drain pipe restricted to a 2 mm opening, the drain cycle is extended to around a 100 seconds. When the drain pipe is completely blocked the drain cycle extends to 300 seconds before the washing machine stops working and displays an error warning.

Figure 5:
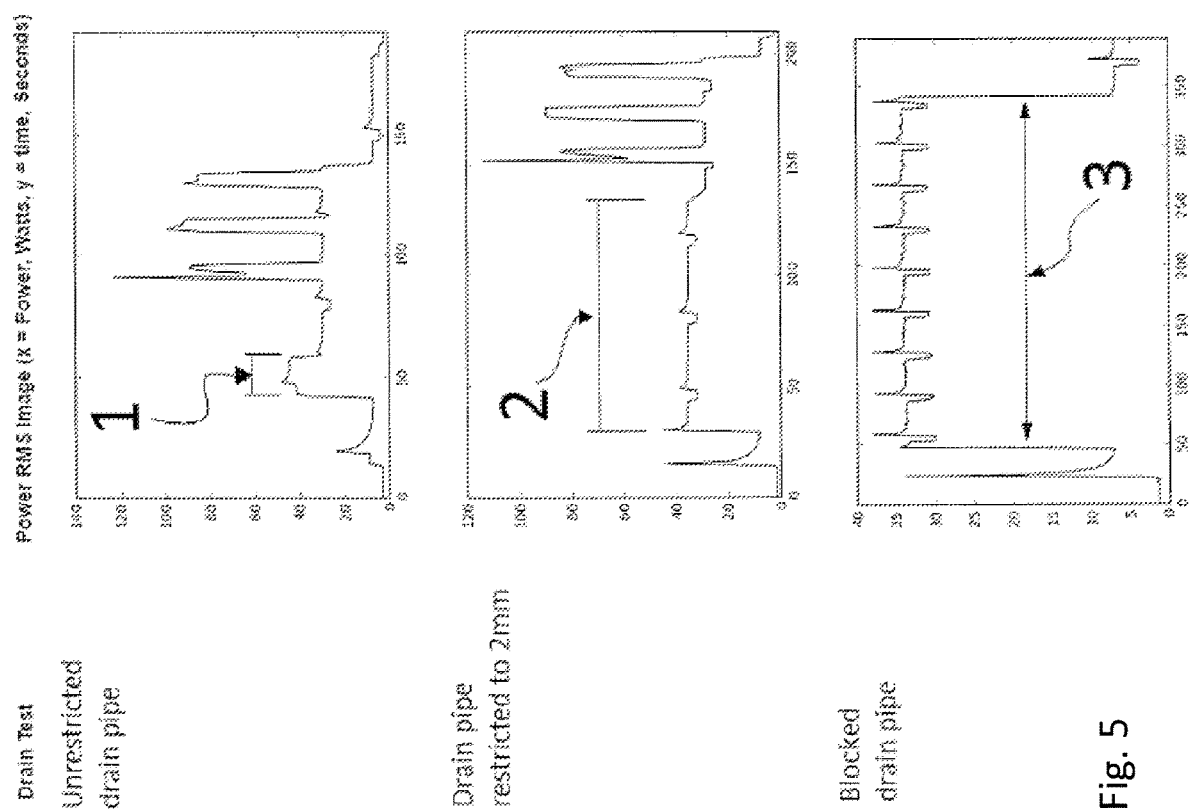
FIG. 5 shows a visualization of a typical washing machine fault developing, where the top graph depicts normal operation, the middle graph depicts data of a washing machine drain pipe being restricted to a 2 mm opening, and the bottom graph depicts the data from the same washing machine when the drain pipe is completely blocked.

Example data for a washing machine fault developing is depicted in FIG. 5. Referring to FIG. 5, part 1 encapsulates the drain portion of a washing machine cycle during normal operation and without any restrictions to the drain pipe works or filters. Part 2 encapsulates the drain portion of a washing machine cycle with the drain pipe restricted to a 2 mm opening simulating the internal drain pipe works or filters starting to restrict due to foreign debris getting trapped within the pipe works or filters. Part 3 encapsulates the drain portion of a washing machine cycle when the drain pipe is completely blocked.

Figure 6:
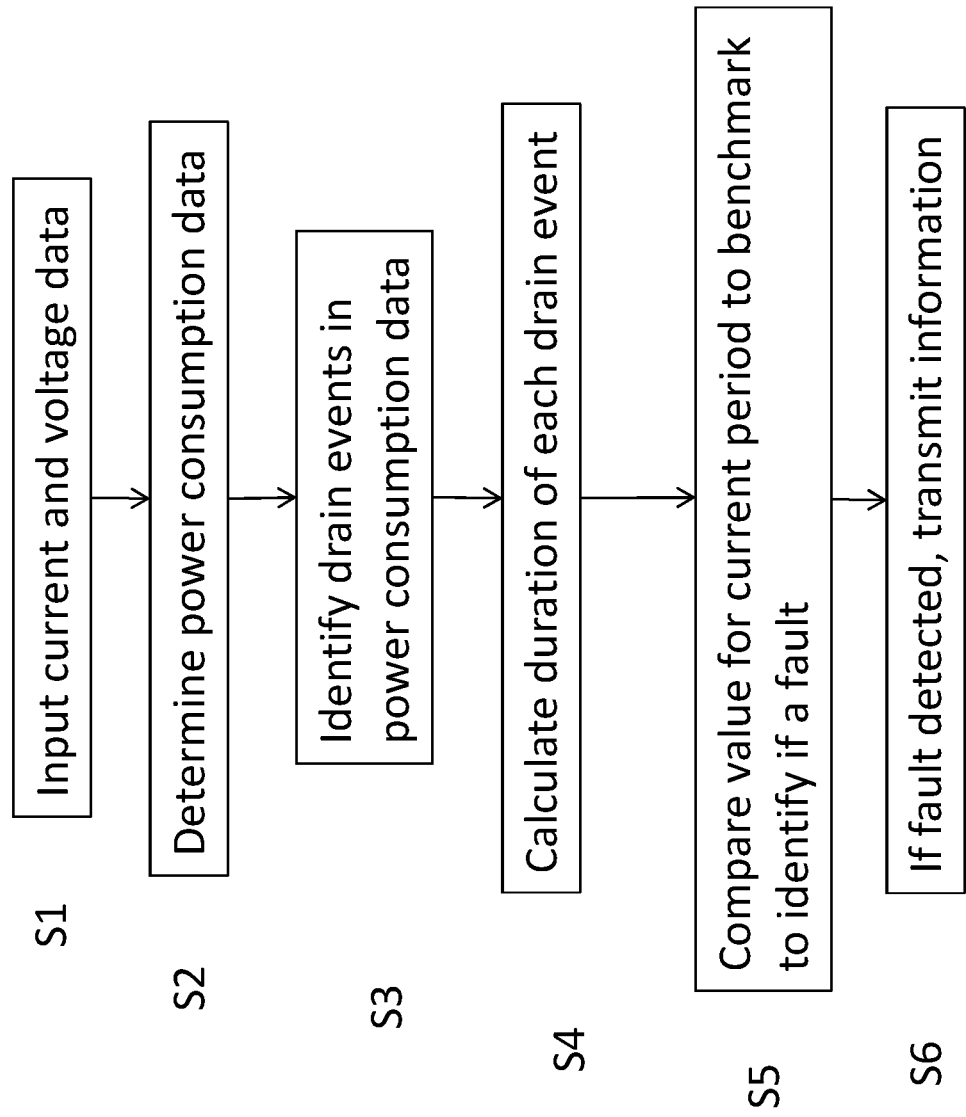
FIG. 6 is a flow chart of another method of monitoring performance of an appliance coupled to a plug.

In this example, the electrical appliance is a washing machine or dishwasher type appliance. A flow chart showing the method of performance monitoring described is shown in FIG. 6. The current and voltage data measured by the sensors is input to the processor 9 in S1, which determines the power consumption data in S2 as has been described previously (for example by determining real power, apparent power and RMS power signals).

A feature set comprising one or more features is then extracted from the power consumption data. The feature comprises information relating to the duration of an event, i.e. the duration of a drain event. Each drain event is identified from the power consumption data in S3. An event identified in any of the real power, apparent power and RMS power signals may be counted as an event for example. Similarly, an event identified in any of the two or three phase signals may be counted as an event for example.

The processor is configured to extract information relating to a drain start time and drain end time from the power consumption data. Each drain start and subsequent drain end is identified from the power consumption data. The drain pump motor switch on may be identified based on the total power consumption delta i.e. the change in power between a data point and the previous data point being greater than a threshold indicates a start time, and the change in power between a data point and the previous data point being less than a threshold indicates the drain end time. Depending on the appliance, the threshold may be in the range 15 W to 45 W for example. Alternatively or additionally, the shift in phase of the current when compared to the voltage (referred to as the power factor) may be continuously monitored for a change indicating the start and end of the drain time. Alternatively or additionally, the magnitude of one or more harmonic components of the current signal may be monitored for a change indicating the start and end of the drain time.

A time stamp corresponding to a drain start is identified and stored. A time stamp corresponding to a subsequent drain end is then identified and stored. These time stamps are then used to determine a duration of the drain event. Thus the turn-on time and turn off time, or alternatively just the duration, may be stored for each drain event. Thus in S4, the duration of each identified drain event is calculated.

Additionally, the average power consumed (real, apparent and RMS, the power factor, the Fourier transform of the on-cycle, the Fourier transform for 500 ms before turn-on and the Fourier Transform for 500 ms after turn-off may be recorded and stored for example.

The processor then compares each duration value to a bench mark value, which may be a previous value, an average drain event duration value calculated from previous values or may be a stored value or table of vales for the model (which may be stored on the device or externally for example). For example, the processor may compare each drain event duration value to an average drain event duration value generated from all previously recorded values. If the current value differs from the benchmark value by greater than or equal to a threshold then a fault is identified, whereby the pipes or filters are blocked. In an embodiment, the threshold is 0.20 on the Z-score scale (normalized standard deviation), corresponding to 20%. Thus if the current drain duration value increases from the average of all previous drain event duration values by more than 20% of the average drain event duration value, a fault is identified, whereby the pipes or filters are blocked.

In an embodiment, the benchmark value is learned from previous cycles, for example the benchmark is an average value of two or more previous cycles. In an embodiment, there are multiple benchmark values depending on the program being used by the washing machine. The particular washing machine program is identified as a pattern of switch-on and switch-off cycles in the power consumption data, and if a new program is used (that the device has never seen before and does not match any of the previously recorded patterns) then a new benchmark is 'learned', i.e. the value for this program is stored, and if the program is used again, an average value over the times the program is used is taken. If a previously used program (with a learned benchmark) is used, then the drain event duration benchmark value corresponding to that program is used to compare to the present drain event duration value.

Information indicating that there is a fault is then sent to the transmitter 10, and transmitted, for example to a user or supplier. In an embodiment, the information is transmitted through an API. The information may comprise the appliance identification, the fault detected, optionally the reasoning behind the fault and optionally the raw data on which the decision was taken. Information may also be sent to the illuminators 12, in response to which one or more illuminators are illuminated to indicate that there is a fault. Information may also be sent to the switch control, such that it may switch off the appliance.

Example 3

In a further example, the plug is attached to an electric vehicle charging system, in which the processor in the plug determines power consumption data and monitors the performance of the electric vehicle using the power consumption data during charging. The plug is then configured to communicate information relating to the performance of the electric vehicle. The plug may further be configured to control the charging schedule of the electric vehicle and provide flexible electric vehicle charging. The plug may further be configured to transmit information relating to the status of the vehicle.

The performance of the electric vehicle may be monitored based on one or more of the instantaneous real, apparent and/or RMS power being consumed, the overall real, apparent and/or RMS power being consumed for the duration of the charging time, the power factor and/or harmonics.

For example, the instantaneous power can indicate a short-circuited cell within the electric vehicle. For example, if the instantaneous power draw is detected to be above a certain threshold (dependent on battery chemistry and size), then a fault whereby there is a short-circuited cell within the electric vehicle is detected.

The overall power consumption can indicate an open-circuit cell within the electric vehicle, since the battery will never reach maximum voltage and therefore the charger will attempt to keep charging the batteries resulting in further damage to the other cells within the battery. Thus the overall power data can be monitored to determine if it reaches a maximum value within a particular time period, whereby if it doesn't reach a maximum value within the time period, a fault is detected, namely an open-circuit cell.

Changes in the power factor and harmonics can also indicate a fault developing within the electric vehicle system.

In an embodiment, the plug is able to detect pattern changes in the appliance current and/or voltage requirements, frequency of the patterns or any other variation in its power demand, and communicate the reported changes to the user and/or the manufacturer of the appliance.

By way of example only, fridges, freezers, tumble dryers, dish washers, air conditioning units and many other domestic appliances exhibit similar changes when the efficiency of the appliance deteriorates. The plug may monitor and report such changes.

In an embodiment, the plug is also able to turn the appliance on or off depending on demand response capabilities imposed or suggested from various energy providers or energy institutions in order to operate the appliance within the time frame of the most efficient electricity tariffs.

In an embodiment, the processor 9 is further configured to receive information from one or more external sources via the communication module 10 and control the set of illuminators 12 (or other type of display module) in order to give feedback to the user regarding whether using the attached appliance would translate into a higher cost than deferring the use of the appliance to a later time when electricity might be cheaper.

The information from external sources can be, by way of example only, from a time of use tariff database, a smart meter, and/or a demand-side-response system provided by a utility.

"Pattern changes" may refer to changes in a collected feature set before and after the occurrence of a fault or a developing fault. In turn, a benchmark feature set may comprise an aggregation of the historic performance of the appliance. The performance data represents an understanding of the appliance power consumption at various instances within its operational cycle. The immediate power consumption cycle is then compared to historic benchmark data to infer performance degradation.

The feature set may comprise varying levels of data depending on the type of appliance being monitored. In an embodiment, a feature set includes one or more of: (a) the on/off frequency or on/off duration, depending on the appliance (for example for the last 61 months); (b) the power (for example current, voltage, power factor and their relationship to each other) consumption (for example over the last 61 months); (c) the average power consumption per hour since the appliance or plug was installed; (d) raw data from the current and voltage sensors for one second around every event.

An event may be considered as a change in power consumption above a certain threshold, for example over a set time period, for example a sudden change.

In an embodiment, only 1 days' worth of event data is stored on the device, and this is uploaded to external servers overnight, as described in further detail below.

More specifically, the AC or DC voltage and current being supplied to the appliance through its power cord B, passes through the plug and is detected by the current and voltage sensors 4. In an embodiment, the current and voltage sensors 4 read the respective current and voltage powering the appliance in real-time. In an embodiment, the current and voltage sensors 4 read the respective current and voltage powering the appliance at rates between a hundred times per second and ten million times per second, depending on the appliance requirements and determined by the microcontrollers or by external sources communicating with the microcontrollers. These rates are hereinafter called 'read frequency'. The output from the voltage and current sensors may be digitized by one or more analogue to digital converters (ADC) 7 and the resultant output of the ADC, hereinafter called 'raw data', is passed on to the microcontrollers 9 for analysis, storage and communication.

The microcontrollers 9 may be built into one or more various printed circuit boards and may contain additional peripherals. The microcontrollers and other low voltage peripherals may be protected from the high voltage or current AC or DC electricity by means of an isolation barrier 6. The isolation barrier 6 may be a physical separation from the AC or DC electricity or through fit for purpose electronic isolation components. By way of example only, the low voltage peripherals may include one or more of the following: a real-time clock, RAM memory, back-up batteries, voltage and or current conditioning circuits and filters, isolating circuits, non-volatile memory, fixed or removable data storage or any other such peripheral for the correct operation and safety of the plug.

The current sensors 4 employed may be differential type sensors such as differential Hall Effect sensors. Alternatively, other current sensors may also be used, such as magnetic pick-up devices with current sensing inductors, for example of a differential type for both AC and DC current monitoring. Alternatively, a low value resistor connected in series to the appliance live or neutral line may also be used. A voltage sensor is also employed. The voltage sensors and the current sensors sample the voltage and current being supplied to the appliance at the read frequency generating the raw data through the ADC 7. The raw data is analysed and stored by the embedded programs running on the microcontrollers and their peripherals 9. The results of the analysis and optionally the raw data are communicated to external resources through the local area network communication devices 10.

The local area network communication devices, by way of example only, can be any communication device such as WiFi, Bluetooth, Zigbee, Z-Wave, or any other wireless communications method permissible to operate in a domestic environment to form part of the local area network, including various protocols and wireless frequencies. Alternatively, power-line carrier communication devices such as HomePlug, X10, or any other power-line carrier communication method permissible to operate in a domestic environment to form part of the local area network, including various protocols, frequencies and narrow or broad band methods may be used. The one or more various communication devices are hereinafter called 'comms devices' or 'connected devices' or 'comms module'.

The communication devices may communicate using a plurality of protocols and/or frameworks. Such frameworks may include a public or private permissioned blockchain framework. The blockchain framework may be used to communicate the information relating to the performance of the appliance. The blockchain framework may also be used to transmit requirements and/or status of the appliance, either in addition to the performance information, or where the performance information is transmitted using a different protocol. The block chain frame work may also be used for communicating Demand-Side-Response information back to a utility or energy provider and/or used to trade energy with neighbouring premises based on the requirements of the premises, either in addition to the performance information, or where the performance information is transmitted using a different protocol.

In an embodiment, all information that is transmitted to the cloud server is put on a blockchain. All the information is therefore on an immutable ledger. The information may be used by the appliance owner (which may be the resident of the house, landlord or the owner renting out the appliance with a pay-per-use system for example). All the transmitted information is added to a smart contract that resides on the distributed ledger. The smart contract is added to a block on the chain. In addition, the plug's switch (relay) may be controlled over the blockchain framework. The smart contract may be accessible to the owner and user of the appliance. The block chain may be used for consumption monitoring and/or usage monitoring as well as performance monitoring. It may be linked to a payment system, for example through a token or Fiat currency.

External resources that do not form part of the plug may also be employed, by way of example only, for additional storage, further analysis and/or user information (e.g. historic usage information, historic power consumption, performance information, etc), however in an embodiment, the plug may be able to fully operate without the employment of such external resources. In fact, in one embodiment, a locally connected device such as a tablet or smart phone, communicating directly with the plug is able to display current and historical usage information of the appliance and/or control various aspects of the programs running on the microcontrollers of the plug and/or turn the said appliance on or off. In an embodiment, all of the analysis performed on the plug is repeated on the cloud for confirmation. In addition, the data may be compared to other similar appliances from other installations (other users) to compare performance data on the cloud.

In another embodiment, the plug forms part of a local connected device network that may host a plethora of unrelated devices and one or more of the said plug. One or more wireless devices communicate with the one or more of the said plug through the said network in order to display current and historical usage information of the said appliance and/or control various aspects of the programs running on the microcontrollers of the said plug and/or turn the said appliance on or off.

In another embodiment, the plug forms part of a local area network that may host a plethora of unrelated devices and one or more of the said plug and is connected to the internet by various means. By way of example only, such means of being connected to the internet may be through a local router that is in turn connected to a telephone line or modem that enables data to be exchanged with the internet, or through a local wireless modem that enables direct exchange of information with the internet over a wireless medium. One or more wireless devices communicate with the plug through the network or through the internet in order to display current and historical usage information of the appliance and/or control various aspects of the programs running on the microcontrollers of the plug and/or turn the appliance on or off.

In yet another embodiment, the plug forms part of a local area network that may host a plethora of unrelated devices and one or more of the said plug and is connected to the internet by various means as described further below. One or more wireless devices communicate with the said plug through the network or through the internet in order to display usage information of the appliance and/or transfer raw data or processed data information of the appliance and/or control various aspects of the programs running on the microcontrollers of the plug and/or turn the appliance on or off. In addition, the plug may be able to communicate over the internet to off-site servers for the purpose of communicating the results of the analysis and optionally the raw data for further analysis, and/or to display current and historical usage information of the appliance and/or control various aspects of the programs running on the microcontrollers of the plug and/or turn the appliance on or off.

In yet another embodiment, the plug is able to download performance information or an entire firmware version pertaining to the same or similar appliances, from off-site servers in order to tailor its operation and analysis information for the specific appliance. For example, benchmark and/or threshold information may be downloaded to the plug and used for the comparison step.

Figure 3:
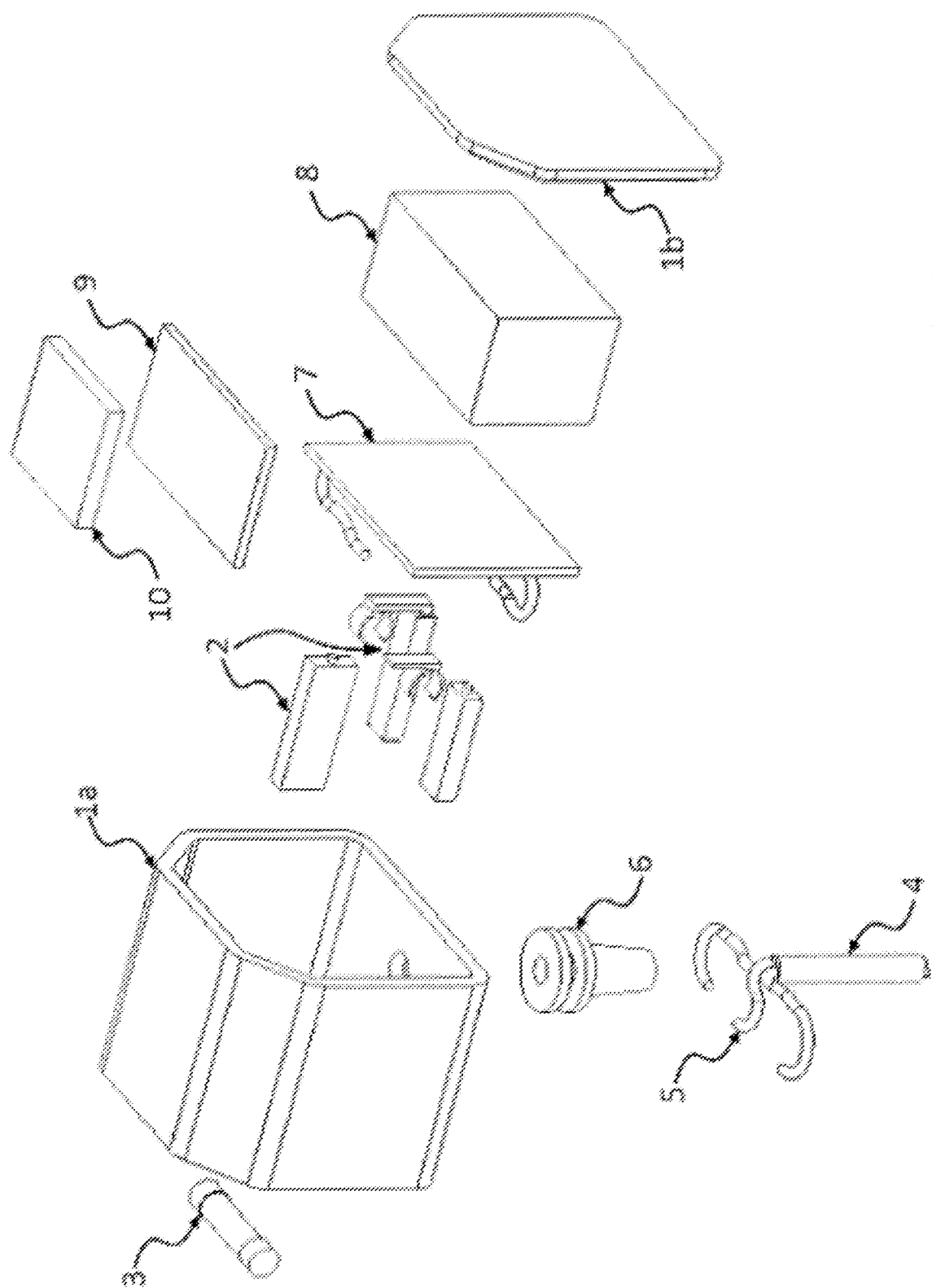
FIG. 3 is an exploded view showing internal components of a power plug according to an embodiment, where the diagram shows the internal printed circuit location in relation to fixed items such as the plug pins 2 and the power cord gland 6.

FIG. 3 illustrates a "smarter" plug circuit assembly and case assembly according to an embodiment. The outer case 1a and 1b house standard 3-prong type plug contacts, including Live/Hot, Neutral, and Earth/Ground, which collectively (2) are connected to the high voltage circuit board 7 through a user accessible fuse 3. Any other alternative plug design may be used however.

The high voltage circuit board 7 comprises one or more of: one or more power supplies 8, one or more current and voltage sensors, one or more electronic switches and a terminal block for user wireable power cord 5. The power cord 4 is in turn passed through a cable gland 6 to support cable movement stresses. Additionally the high voltage circuit 7 board is physically separated from the low voltage circuit board 9 and power and signal connections are isolated through the employment of electronic isolation components, herein referred to as the isolation barrier. The isolated analogue signal is connected to the ADC through the isolation barrier where the signal is digitised into raw data.

In an embodiment, the raw data is passed onto the microcontrollers and other peripherals for analysis, storage and communication. The said microcontrollers and peripherals are able to pass the data onto the comms devices 10. The comms devices, by way of example only, can be WiFi, Bluetooth, Zigbee, Z-Wave, or any other wireless communications method permissible to operate in a domestic environment to form part of the local area network, including various protocols and wireless frequencies. Alternatively, power-line carrier communication devices such as Home-Plug, X10, or any other power-line carrier communication method permissible to operate in a domestic environment to form part of the local area network, including various protocols, frequencies and narrow or broad band methods may be used.

The microcontrollers and peripherals may also be able to pass the data onto storage modules, whether fixed or removable type storage. The storage modules can be any non-volatile fixed or removable storage, by way of example only, such as USB driver, SD Cards, SSD drives, Hard-disks, and any other form of storage medium whether user removable or internally fixed medium permissible to operate in a domestic environment including various protocols and methods.

The said microcontrollers and peripherals may also be able to control and receive feedback from the set of illuminators and switches respectively. The illuminators may be of LED type and provide the user with feedback of a visual nature on the status and operation of the device. The switches provide a means for the user to interact with the plug at a basic level, by way of example only, to switch the said appliance on or off, and/or store the data of an event, and/or set the plug into different modes of operation such as initializing communication to a wireless medium, and/or reset the plug to factory defaults and/or any other functions pre-programmed into the microcontrollers and peripheral or functions determined by the external resources communicating with the plug.

In an embodiment, the processor 9 is further configured to control and receive feedback from one or more other energy sources via the communication module 10 and control the one or more other energy sources to release energy for use by the attached appliance. The energy source can be, by way of example only, a battery storage system storing electricity, a solar panel generating electricity whether through an inverter or supplying the electricity directly, or any other energy storage or generation system located within or external to the premises.

For example, the plug may control a battery via an API to release or store energy. The plug, being connected to the same network infrastructure (for example wirelessly) as the battery, may be configured to use an API to instruct the battery that power is required for the appliance, since the appliance has turned on or is preparing to turn on. The plug may also transmit the probable energy usage (future demand) of the appliance to the battery, or another device that commands the battery, to reserve energy for the appliance.

In an embodiment, there is provided a self-contained, in-line electrical plug encapsulating a number of miniature printed circuit boards assembled into the plug body such that the AC or DC electricity from an electrical socket passes through the plug to the appliance wire directly. The circuit boards may comprise one or more power supplies, microcontrollers, current sensors, voltage sensors, electronic switches such as a relays, illuminated indicators and comms devices. The plug may be able to read voltage and current at high frequency to store, analyse and communicate the performance of the appliance. The plug may also be capable of turning the appliance on or off when instructed by the internal microcontrollers or external sources. The plug may be able to monitor the performance of the appliance over time detecting whether the appliance is operating efficiently and turn the appliance on or off depending on demand response capabilities imposed or suggested through various energy providers. In an embodiment, the plug is also capable of giving user feedback through a display module, for example illuminators. In an embodiment, the plug is also capable of communicating using a blockchain framework. In an embodiment, the plug is also capable of controlling energy storage or energy generation systems to make the most efficient use of the available electricity.

While certain embodiments have been described, these embodiments have been presented by way of example only, and are not intended to limit the scope of the inventions. Indeed the novel methods and apparatus described herein may be embodied in a variety of other forms; furthermore, various omissions, substitutions and changes in the form of methods and apparatus described herein may be made.

The invention claimed is:

1. A power plug for coupling an electrical appliance to an electrical power supply, comprising:
   a current sensor, configured to measure current supplied through the plug to the electrical appliance;
   a voltage sensor, configured to measure voltage supplied through the plug to the electrical appliance;
   a processor configured to:
      determine power consumption data from data relating to the current and voltage measurements made by the current and voltage sensors;
      monitor the performance of the electrical appliance using the power consumption data, such that a fault in the electrical appliance can be determined or anticipated, by:
         repeatedly generating a feature set using the power consumption data by extracting a portion of the power consumption data at regular time intervals and storing the generated feature sets in a memory module, wherein the feature set comprises one or more of: information relating to a switch-on frequency of one or more components of the electrical appliance, information relating to a duration of switch on time of one or more components of the electrical appliance, information relating to an event during an operation cycle, amount of power consumed over a period of time, and amount of power consumed at regular intervals during a time period identified using an event, duration of an event, or time of occurrence of an event within an operation cycle; and
         comparing each generated feature set to comparison data to determine or anticipate a fault in the electrical appliance, wherein the comparison data comprises a benchmark value learned from the one or more of the feature sets previously generated, including power consumption data from previously measured current and voltage measurements, wherein the feature set corresponding to a current time interval is compared with the feature set generated for one or more previous time intervals; and
   a transmitter, configured to transmit information relating to the performance of the electrical appliance.

2. The power plug according to claim 1, wherein repeatedly generating a feature set comprises:
   monitoring the power consumption data for an event;
   extracting a portion of the power consumption data, the portion being identified using the event;
   extracting the feature set from the portion.

3. The power plug according to claim 2, wherein comparing each generated feature set to comparison data comprises:
   comparing the feature set extracted from the portion to a feature set generated using one or more feature sets generated for previously extracted portions.

4. The power plug according to claim 1, wherein the memory module comprises a non-volatile memory configured to store the generated feature sets.

5. The power plug according to claim 1, wherein information relating to switch on frequency comprises one or more of: the number of times the component switches on in a fixed time period, the average number of times the component switches on in a fixed time period where the average is taken over a longer fixed time period, the time between a switch on and switch off, and the average time between a switch on and switch off.

6. The power plug according to claim 1, wherein the current sensor is configured to measure current supplied through the plug to the electrical appliance at a first sampling frequency and wherein the voltage sensor is configured to measure voltage supplied through the plug to the electrical appliance at a second sampling frequency.

7. The power plug according to claim 6, wherein the second sampling frequency is greater than or equal to 1 MHz.

8. The power plug according to claim 1, wherein the processor is further configured to:
   identify a decrease in performance when a difference between the current generated feature set and the comparison data passes a threshold difference.

9. The power plug according to claim 8, further comprising:
   an electronically controlled switch configured to allow power supply to the electrical appliance in a first configuration and prevent power supply to the electrical appliance in a second configuration;
   the processor being further configured to:
   instruct the switch to transition from the first configuration to the second configuration in response to an instruction received at the communication module or in response to an identified decrease in performance or in response to user input.

10. The power plug according to claim 8, further comprising:
    a display module, configured to display when a decrease in performance is identified.

11. The power plug according to claim 1, wherein the performance is monitored in real-time.

12. The power plug according to claim 1, further comprising:
    an isolation component, wherein the voltage sensor is coupled to the processor through the isolation component.

13. The power plug according to claim 1, wherein the communication module is configured to communicate with other locally networked devices.

14. The power plug according to claim 1, wherein the communication module is configured to communicate over an internet connection.

15. An electrical appliance, comprising the power plug of claim 1.

16. A method of monitoring performance of an electrical appliance coupled to a power plug, comprising:
    measuring current supplied through the plug to the electrical appliance;
    measuring voltage supplied through the plug to the electrical appliance;

determining power consumption data from data relating to the current and voltage measurements made by the current and voltage sensors;

monitoring the performance of the electrical appliance using the power consumption data, such that a fault in the electrical appliance can be determined or anticipated by:

repeatedly generating a feature set using the power consumption data by extracting a portion of the power consumption data at regular time intervals and storing the generated feature sets in a memory module, wherein the feature set comprises one or more of: information relating to a switch-on frequency of one or more components of the electrical appliance, information relating to a duration of switch on time of one or more components of the electrical appliance, information relating to an event during an operation cycle, amount of power consumed over a period of time, and amount of power consumed at regular intervals during a time period identified using an event, duration of an event, or time of occurrence of an event within an operation cycle; and comparing each generated feature set to comparison data to determine or anticipate a fault in the electrical appliance, wherein the comparison data comprises a benchmark value learned from the one or more of the feature sets previously generated, including power consumption data from previously measured current and voltage measurements, wherein the feature set corresponding to a current time interval is compared with the feature set generated for one or more previous time intervals; and transmitting information relating to the performance of the electrical appliance.

* * * * *